United States Patent
Smythe, III et al.

(10) Patent No.: US 7,271,463 B2
(45) Date of Patent: Sep. 18, 2007

(54) TRENCH INSULATION STRUCTURES INCLUDING AN OXIDE LINER THAT IS THINNER ALONG THE WALLS OF THE TRENCH THAN ALONG THE BASE

(75) Inventors: John A. Smythe, III, Boise, ID (US); William Budge, Homedale, ID (US)

(73) Assignee: Micron Technology, Inc., Boise, ID (US)

( * ) Notice: Subject to any disclaimer, the term of this patent is extended or adjusted under 35 U.S.C. 154(b) by 220 days.

(21) Appl. No.: 11/009,665

(22) Filed: Dec. 10, 2004

(65) Prior Publication Data

US 2006/0125043 A1 Jun. 15, 2006

(51) Int. Cl.
*H01L 23/58* (2006.01)
(52) U.S. Cl. .................. 257/510; 257/637; 257/640
(58) Field of Classification Search ................. 257/641
See application file for complete search history.

(56) References Cited

U.S. PATENT DOCUMENTS

| | | | |
|---|---|---|---|
| 4,855,804 A | 8/1989 | Bergami et al. | |
| 5,087,586 A | 2/1992 | Chan et al. | |
| 5,447,884 A | 9/1995 | Fahey et al. | |
| 5,492,858 A | 2/1996 | Bose et al. | |
| 5,702,976 A | 12/1997 | Schuegraf et al. | |
| 5,869,384 A | 2/1999 | Yu et al. | |
| 6,027,982 A | 2/2000 | Peidous et al. | |
| 6,037,238 A | 3/2000 | Chang et al. | |
| 6,046,487 A | 4/2000 | Benedict et al. | |
| 6,461,937 B1 | 10/2002 | Kim et al. | |
| 6,500,726 B2 | 12/2002 | Lee et al. | |
| 6,518,148 B1 | 2/2003 | Cheng et al. | |
| 6,576,558 B1 * | 6/2003 | Lin et al. | 438/700 |
| 6,657,276 B1 | 12/2003 | Karlsson et al. | |
| 6,699,799 B2 | 3/2004 | Ahn et al. | |
| 6,717,231 B2 | 4/2004 | Kim et al. | |
| 6,956,276 B2 | 10/2005 | Hokazono | |
| 7,176,104 B1 * | 2/2007 | Chen et al. | 438/424 |
| 2002/0022326 A1 | 2/2002 | Kunikiyo | |
| 2003/0022522 A1 * | 1/2003 | Nishiyama et al. | 438/762 |
| 2004/0099928 A1 | 5/2004 | Nunan et al. | |

OTHER PUBLICATIONS

Peters, Laura, "Choices and challenges for shallow trench isolation," *Semiconductor International*, Website www.reed-electronics.com, 6 pages, Apr. 1, 1999.
Advertisement entitled "Polysilazane SODs Spinfill™ 400 Series for STI/PMD Application,", 2004.

* cited by examiner

*Primary Examiner*—Stephen W. Smoot
(74) *Attorney, Agent, or Firm*—Knobbe, Martens, Olson & Bear, LLP

(57) ABSTRACT

A method of depositing dielectric material into sub-micron spaces and resultant structures is provided. After a trench is etched in the surface of a wafer, a liner layer preferably is deposited into the trench. An anisotropic plasma process is then performed on the trench. A silicon layer may be deposited on the base of the trench during the plasma process, or the plasma can treat the liner layer. The trench is then filled with a spin-on precursor. A densification or reaction process is then applied to convert the spin-on material into an insulator, and oxidizing the silicon rich layer on the base of the trench. The resulting trench has a consistent etch rate from top to bottom of the trench.

37 Claims, 6 Drawing Sheets

TRENCH INSULATION STRUCTURES INCLUDING AN OXIDE LINER THAT IS THINNER ALONG THE WALLS OF THE TRENCH THAN ALONG THE BASE

REFERENCE TO RELATED APPLICATIONS

This application is related to and incorporates by reference in their entireties the following: U.S. application Ser. No. 10/782,997, filed Feb. 19, 2004 and U.S. application Ser. No. 10/925,715, filed Aug. 24, 2004.

FIELD OF THE INVENTION

This invention relates generally to the field of integrated circuit fabrication, and more specifically to trench isolation and methods therefor.

BACKGROUND OF THE INVENTION

Integrated circuit (IC) manufacturers increasingly face difficulties with scaling and insulation between components with ever decreasing feature sizes. Even though packing transistors closer is important to the concept of increasing IC speed and decreasing size, they must still be electrically separated from each other. One method of keeping transistors separate from each other is known as trench isolation. Trench isolation is the practice of creating trenches in the substrate in order to separate electrical components on the chip. The trenches are typically filled with an insulator that will prevent cross-talk between transistors.

Shallow trench isolation (STI), which is becoming quite prevalent in modern IC design, uses trenches that are substantially narrower than field isolation elements created by older isolation technology, such as LOCal Oxidation of Silicon (LOCOS). The size can vary, but a trench less than one half of a micron wide has become quite common. STI also offers smaller channel width encroachment and better planarity than technologies used in earlier IC generations. Good insulating trenches are important for devices such as dynamic random access memory (DRAM), which uses trenches to separate transistors of individual memory cells.

During the deposition process and subsequent steps, however, the trench walls can be damaged. A silicon nitride liner, which has substantial stress-relieving capabilities for the sidewalls of the trench, may be added before trench fill. Such liners are often used for high density ICs, such as DRAM chips, to protect bulk silicon during subsequent process steps.

In order to provide good isolation properties, the trench is then typically filled with an insulator such as a form of silicon oxide. The oxide can be deposited in a number of methods, such as CVD, sputtering, or a spin-on deposition process. Spin-on insulators are becoming more prevalent, because they fill low points first and thus fill trenches more evenly. Additionally, spin-on deposition (SOD) dielectric materials, which often form silicon oxide after being reacted, carry less risk of voids in the resulting insulating material than other deposition processes. SOD precursors are deposited as a liquid, and then reacted to form silicon oxide using a high temperature oxidation process.

However, the use of SOD insulators in the trench can also raise issues upon the conversion from liquid precursor to its final insulating form. Three interrelated problems arise upon the conversion from precursor to insulation material: poor rebonding, volume shrinkage, and wet etch rate gradients. Upon densification, the insulation material bonds to the walls of the trench, but if the bonds are not very strong, the insulator will be easily etched near the side of the trench during subsequent etch processes. These bonds and the general crystal structure can be weakened due to the volume shrinkage during densification of the SOD material pulling the SOD material away from the sidewalls. This can change the angles in the crystal structure, resulting in easily broken bonds and high etch rates.

During fabrication of a semiconductor device, the trench is typically exposed to several etching steps. If the trench fill material has different etch rates in different regions, it will be hard to control the etch processes to avoid removing the trench fill. This problem is particularly true at the walls of the trench, where the fill material is less dense due to volume shrinkage. The etch process can create voids along the walls of the trench, reducing the effectiveness of the trench structure as an isolating device.

Problems relating to the formation of the densified SOD material are common and can cause significant problems for IC designers. Accordingly, better methods of SOD integration are needed for trenches.

SUMMARY OF THE INVENTION

In a first aspect of the invention, a method of forming an isolation structure is disclosed. The method comprises forming a recess within a substrate and depositing an insulating liner within the recess. The recess is exposed to a plasma process after depositing the insulating liner to form a silicon rich layer at a base of the recess. A spin-on deposition (SOD) precursor is deposited after exposing the recess to the plasma process. The SOD precursor is converted to an insulating layer, wherein converting the SOD precursor includes expanding the silicon rich layer.

In another aspect of the invention, an electrical isolation structure is disclosed. The isolation structure comprises a trench formed in a substrate and a thermal oxide in a base of the trench. The thermal oxide is substantially thinner along the walls than along the base. A spin-on dielectric overlies the thermal oxide.

A method of forming a computer memory device is disclosed in another aspect of the invention. The method comprises forming a trench in a substrate and anisotropically depositing a silicon-based layer along a base of the trench. An insulator material is deposited into the trench after depositing the silicon-based layer. The silicon-based layer is at least partially converted into silicon oxide during or after depositing the insulator material.

In another aspect of the invention, a method of improving density of a spin-on dielectric is disclosed. The method comprises providing a liner within a recess in a substrate. Silicon is deposited on at least part of the liner using a primarily anisotropic plasma deposition process. A spin-on deposition (SOD) dielectric precursor is deposited within the liner.

In another aspect of the invention, an integrated circuit having an electrical isolation structure is disclosed. The structure comprises a trench formed in a recess. An insulating liner overlies a floor and sidewalls of the trench. A thermal oxide layer is preferentially formed on the floor of the trench. The trench further comprises a spin-on deposition dielectric over the thermal oxide layer within the trench.

BRIEF DESCRIPTION OF THE DRAWINGS

These and other aspects of the invention will be better understood from the Detailed Description of the Preferred Embodiments and from the appended drawings, which are meant to illustrate and not to limit the invention, and wherein.

DETAILED DESCRIPTION OF THE PREFERRED EMBODIMENT

It has been found that the undesirable etch rate gradients can be attributed to the volume shrinkage of insulation materials in trenches and the associated weak crystal structure. Normal shrinkage of spin-on deposition (SOD) dielectric materials is believed to cause increased tensile bond stress and a weakened interface between densified SOD dielectrics and trench walls.

Thus, the inventors have found it desirable to anisotropically treat the base of the trench. In one embodiment, a silicon rich base layer is deposited over the base of the trench. In another embodiment, an insulating liner layer is treated using an anisotropic plasma process which produces a thin silicon rich portion of the liner layer. In either of the above embodiments, the silicon rich layer will expand upon densification of the spin-on deposition material and at least partially compensate for the volume shrinkage of the SOD material.

In a preferred embodiment, described in more detail below, the process begins with the definition of an opening or void in a semiconductor substrate. The described embodiment is a shallow trench isolation (STI) structure, but the process can be used for filling other trench-type structures. An insulation liner, such as silicon nitride, can then be formed within the trench. An anisotropic plasma process forms a silicon rich material at the base of the trench. A SOD precursor is then deposited over the substrate and into the trenches. The SOD material is densified, preferably in a steam ambient environment, which expands any exposed silicon present in the trench while converting it to silicon oxide.

Forming a Trench

Figure 1:
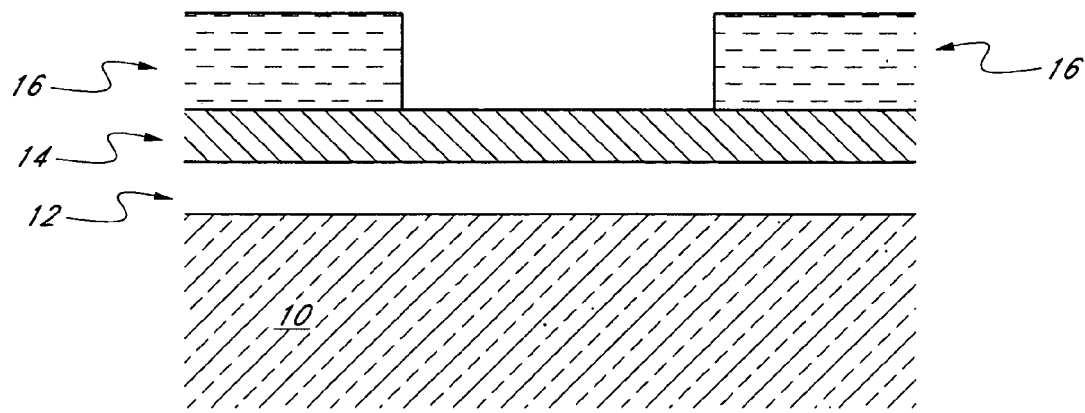
FIG. 1 is a schematic, cross-sectional view of the substrate with a thin "pad oxide" grown over the surface of the substrate, a thicker layer of silicon nitride ($Si_3N_4$), and a photoresist mask in accordance with a starting point for preferred embodiments of the present invention.

An introductory step is the creation of a trench, preferably for shallow trench isolation (STI). The trench can be of varying widths, but in a preferred embodiment, the trench is less than a micron wide. As shown in FIG. 1, a semiconductor substrate 10, e.g., a silicon wafer, is provided and a thin "pad" oxide 12 is thermally grown on the substrate. In some embodiments, a thicker insulating layer 14, preferably silicon nitride or $Si_3N_4$, is formed over the pad oxide 12. The nitride 14 is preferably formed by chemical vapor deposition (CVD). This nitride layer 14 acts as a stop for a subsequent etch back, such as a CMP process. Exemplary thickness ranges are between about 30 Å and 100 Å for the pad oxide 12 and between about 200 Å and 1500 Å for the nitride layer 14.

As shown in FIG. 1, a photoresist mask 16 is applied to the substrate 10 in order to etch the trench. Traditional lithography techniques are preferably used to form the photoresist mask 16. Using the photoresist mask 16, a recess, preferably a trench for isolation, is formed in the substrate. After the trench is etched, the photoresist mask 16 of FIG. 1 is removed by a conventional resist strip process. The trench depth is preferably between about 1,000 Å and 10,000 Å, more preferably between about 2,500 Å and 6,000 Å. The trench can also be formed through the use of a hard mask or by other methods. The skilled practitioner will appreciate that the trench can be formed by several different procedures.

Figure 2:
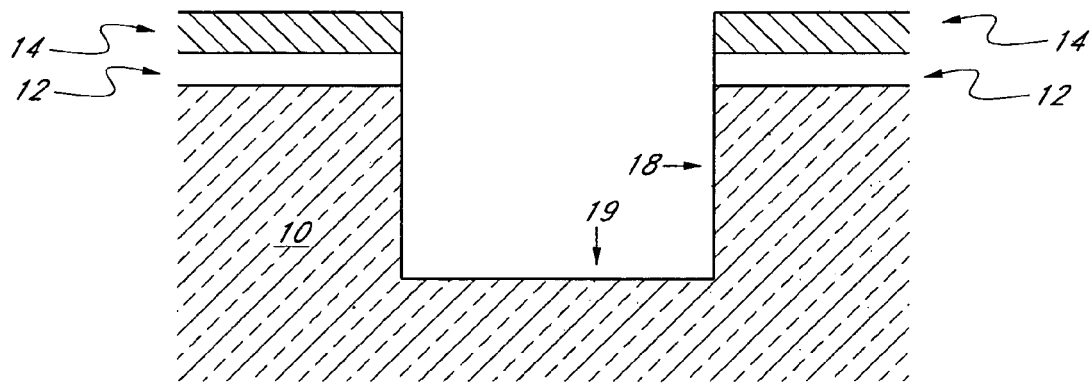
FIG. 2 is a schematic, cross-sectional view of the substrate of FIG. 1 after a trench has been formed.

The trench is preferably etched by an anisotropic etch, i.e. a directional etch, which produces relatively straight, vertical sidewalls. An exemplary etch process is reactive ion etch (RIE). As shown in FIG. 2, this method is quite accurate and straight. However, RIE can also damage the edges of transistor active areas, defined by the sidewalls 18 of the trench. In one embodiment, the sidewalls 18 and base 19 of the trench are oxidized, forming a thin oxide layer (not shown) in order to repair any damage from the anisotropic etch process.

Applying a Liner Layer

Figure 3:
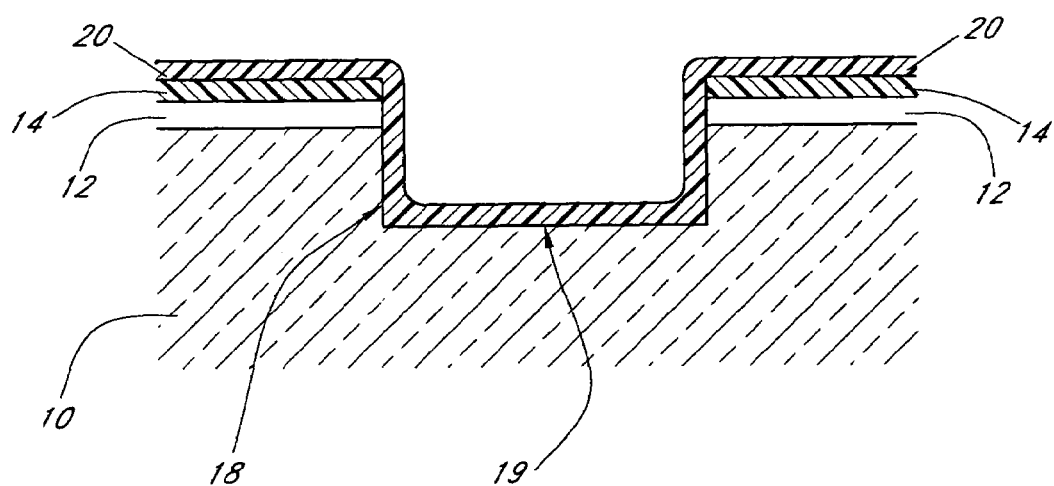
FIG. 3 is a schematic, cross-sectional view of the substrate of FIG. 2 with an insulating layer lining the trench.

As seen in FIG. 3, an insulating liner layer 20 is deposited to line the trench walls 18 and the base 19, or floor, of the trench. Preferably, though not necessarily, the liner layer 20 is a silicon containing material. In a preferred embodiment, the liner layer 20 is a silicon nitride. The liner 20 can also act as a barrier to prevent stressing and oxidation of the substrate during subsequent processing. The liner layer 20 can be deposited by any of a variety of deposition methods, including CVD, atomic layer deposition (ALD), and sputtering. An additional method of deposition is ion-metal plasma deposition, a sputtering process with magnetic collimation. While silicon nitride deposited by CVD is described here, other materials and deposition processes can be used to form a liner layer.

In a preferred embodiment, the liner layer 20 has a thickness of between about 50 Å and 100 Å, more preferably between about 65 Å and 75 Å. The thickness of the insulation layer 20 is typically easily controlled, usually by the length of the deposition process, deposition precursors or other factors.

Plasma Treatment

In order to improve the trench fill process, a plasma treatment is performed upon the trench, preferably after the liner layer 20 has been deposited. In a preferred embodiment, an anisotropic process is performed, wherein the base 19 is more affected by the plasma treatment than the walls 18 of the trench. The plasma treatment process preferably anisotropically forms a silicon rich layer at the base 19 of the trench. In one embodiment, a silicon layer is deposited preferentially at the bottom or base 19 of the trench. However, plasma treatment without deposition is also beneficial.

A description of a silicon nitride layer with a silicon rich exterior can be found in application Ser. No. 10/925,715, filed Aug. 24, 2004, entitled "Liner For Shallow Trench Isolation", filed by Trivedi et al., which is hereby incorporated by reference herein. That application discloses several different conformal liner layers with varying composition to improve rebonding between the walls of the trench and the densified insulation material. The conformal liner layers of the '715 application are preferably formed through a deposition process that provides varying levels of silicon content by altering the flow rates of the source gases. In preferred embodiments of that invention, the nitride content of the liner layer is graded on all sides of the liner, with the highest nitrogen levels near the walls and base of the trench, and lower towards the interior of the trench. This provides for improved rebonding and compression as the silicon rich layer expands during oxidation.

However, when the insulation material is compressed from three sides, problems can arise with different material densities and etch rates across the trench when using the process of the '715 application. High etch rates at the bottom of the trench could yield an unfilled trench after exposure to wet cleans. Thus, in preferred embodiments of the present invention, an anisotropic process is used to preferentially treat the base of the trench.

In a preferred embodiment, an in situ plasma is used for the anisotropic plasma process. Many plasma chambers can be used to treat the trench. One preferred chamber is the Speed™ high density plasma chamber commercially available from Novellus, Inc. of San Jose, Calif. Depending on reactant gases selected, the Speed™ chamber can deposit or simply treat the trench with plasma.

Figure 4A:
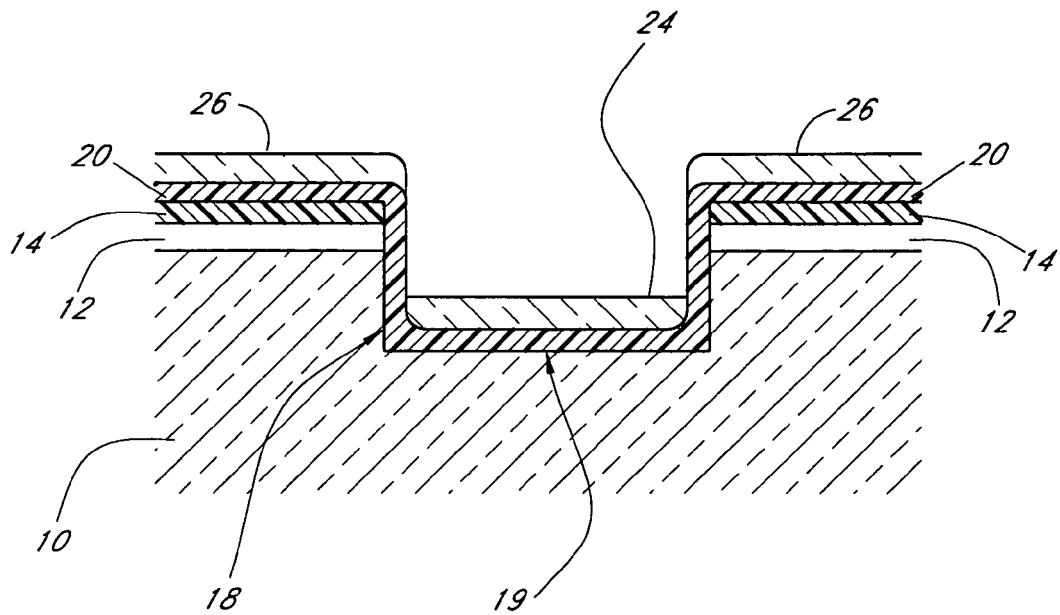
FIG. 4A is a schematic, cross-sectional view of the substrate of FIG. 3 with a silicon rich layer selectively deposited over horizontal surfaces in and surrounding the trench.

In a preferred embodiment seen in FIG. 4A, a silicon rich base layer 24 is deposited on the base 19 of the trench during the plasma process. Because of the anisotropic nature of the plasma process, an upper silicon rich layer 26 will also be deposited on other horizontal surfaces. Typically, the upper silicon rich layer 26 will have a thickness that is similar to the silicon rich base layer 24. In preferred embodiments, very little silicon is deposited on the vertical sidewalls 18 of the trench due to the anisotropic nature of the plasma deposition process. Thus, the silicon rich layer is not shown along the vertical walls, but it will be understood that a lesser thickness of silicon rich material (preferably less than one third, more preferably less than one fifth) compared to the thickness of the silicon rich base layer 24. The upper silicon rich layer 26 may be removed before deposition of the SOD precursor. If the upper silicon rich layer 26 remains, it will form silicon oxide during the densification of the SOD material, but such overlying thermal oxide will not form part of the final structure.

In a preferred embodiment, the base layer 24 is a silicon layer, such as polysilicon or amorphous silicon. However, other materials, such as silicon rich silicon oxide (more Si than stoichiometric $SiO_2$), can be anisotropically deposited in the trench. Preferably, the ratio of silicon in the deposited layer is high enough so that upon densification of a spin-on deposition precursor, oxidation causes the base layer 24 to expand vertically.

Skilled practitioners will appreciate that there are several methods of anisotropically depositing a silicon rich base layer 24. Using the Speed™ high density plasma chamber, the flow rates of precursors are balanced with the amount of plasma treatment of the horizontal surfaces desired.

Exemplary processes for the Speed™ high density plasma chamber use silane ($SiH_4$), as the silicon precursor, and oxygen ($O_2$). Flow rates for silane range from between about 1 sccm to 100 sccm, more preferably between about 15 sccm and 85 sccm. Flow rates for oxygen are preferably between about 0 sccm and 15 sccm, more preferably between about 1 sccm and 10 sccm. Other gases can be used to stabilize and tune the plasma. Preferred gases for this include helium, a helium/hydrogen combination, and argon. Flow rates vary depending upon the precursor gas selected and the flow rates of the other precursor gases. The skilled artisan will appreciate that the silicon rich base layer can be deposited using any of a variety of chambers, each having slightly different settings and parameters.

In a preferred embodiment, the thickness of the deposited silicon rich layer 24 is between about 50 Å and 250 Å, more preferably between about 100 Å and 150 Å. More generally, the thickness of this layer will depend on the selected trench depth.

Figure 4B:
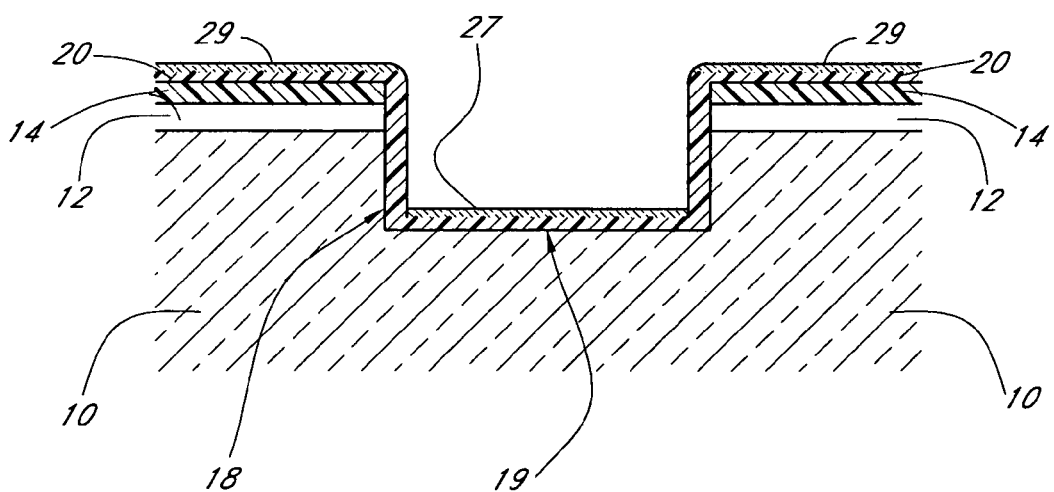
FIG. 4B is a schematic, cross-sectional view of the substrate of FIG. 3 with horizontal surfaces of the insulating liner selectively converted to a silicon rich layer.

Plasma treatment without deposition is also helpful to the trench fill process. This process is illustrated in FIG. 4B. With a plasma treatment process alone, nitrogen from the silicon nitride liner layer 20 is gettered away from the surface of the liner layer 20, preferentially on the base 19 of the trench and other horizontal surfaces. While there will be some effect on vertical walls, vertical walls are preferably substantially less affected by the plasma treatment. This will form a silicon rich layer 27 near the surface of the liner layer 20 over the base 19 of the trench, as well as forming a silicon rich layer 29 on other horizontal surfaces of the liner layer 20. Such a silicon rich base layer 27 near the spin-on deposition (SOD) precursor improves re-bonding of the densified SOD material to the liner layer and vertically displaces the SOD material from only one side. In preferred embodiments illustrated in FIG. 4B, the anisotropic plasma preferentially affects the horizontal surfaces, with the vertical surfaces being less affected by the plasma treatment process. The liner layer 20 along the trench walls 18 and other vertical surfaces are significantly less altered by the plasma treatment process.

In a preferred plasma treatment without deposition, several reactants can be used, including oxygen, hydrogen, and inert bombardment such as by helium radicals. Chambers can be used to treat the plasma with or without deposition, so the chamber can be the same as mentioned above. In a preferred embodiment, an oxygen source, preferably $O_2$, is provided with a flow rate of between about 0 sccm and 50 sccm, more preferably the flow rate is between about 5 sccm and 25 sccm. Hydrogen is preferably provided in the form of $H_2$, with a flow rate of between about 0 sccm and 500 sccm, more preferably between about 50 sccm and 100 sccm. Helium is used primarily to tune the pressure and stabilize the plasma, with flow rates preferably between about 0 sccm and 500 sccm. Argon may also be used in treating the trench, with flow rates of between about 50 sccm and 100 sccm. Preferably, the power is between about 1000 W and 4000 W, more preferably between 3000 W and 4000 W.

In a preferred embodiment, the thickness of the gettered silicon rich layer 27 is between about 3 Å and 10 Å, more preferably between about 5 Å and 8 Å.

An anisotropic plasma process, either with or without deposition, forms a silicon rich layer on the base of the trench that helps to improve the rebonding and crystal structure of the SOD material. Because the process is anisotropic, the vertical surfaces are substantially less affected by the plasma process. This enables a one-directional (vertical) compensation for volume shrinkage.

Trench Fill Process

After the plasma treatment and/or deposition of a silicon rich layer, the trench is filled with an insulator. Preferably the insulator is a non-conductive oxide, such as silicon oxide. Preferably, a spin-on deposition precursor is deposited over the substrate and within the trench.

Figure 5:
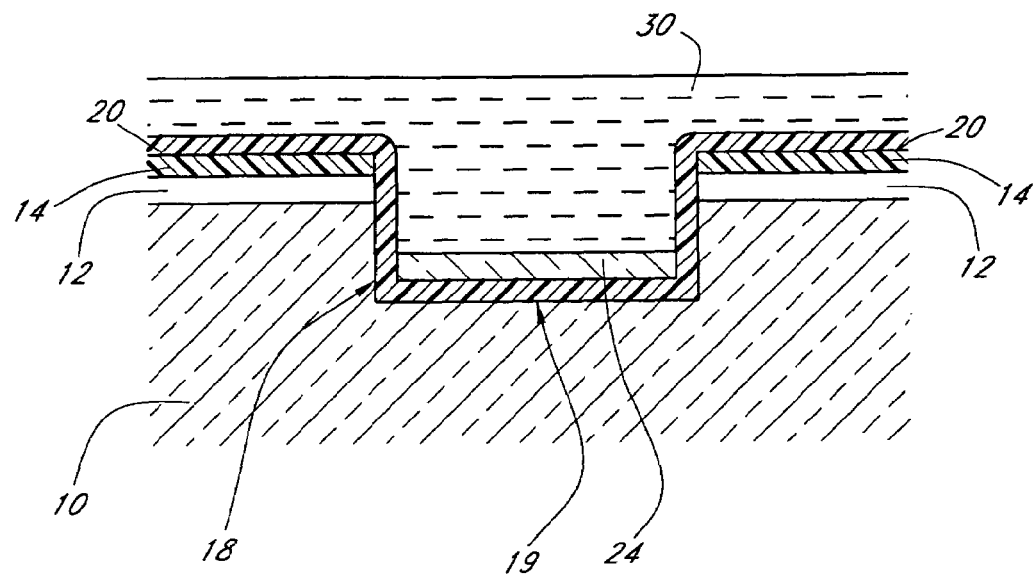
FIG. 5 is a schematic, cross-sectional view of the substrate of FIG. 4A with a layer of spin-on dielectric precursor material filling the trench.

In FIG. 5, an insulator precursor material 30 has been deposited within the trench. The embodiment illustrated in FIGS. 5-7 uses the embodiment of FIG. 4A. As mentioned above, the upper silicon rich layer 26 outside of the trench may be removed or it may remain over the liner layer. It is illustrated as having been removed, but in a preferred embodiment of the invention, the upper silicon rich layer 26 is oxidized during the SOD densification process. In any case, such upper thermal oxide, if present, would be removed during a subsequent etch back. A spin-on deposition process is preferably used to deposit the precursor 30 into the remaining space in the trench, as shown in FIG. 5. The thickness of the insulation precursor 30 will vary based upon the size of the trench, but in the illustrated embodiment the thickness of the material is preferably between 2500 Å and 5500 Å, more preferably between 3000 Å and 4500 Å.

Spin-on deposition uses liquid materials dispensed in a stream of fixed volume or dripped on the substrate after formation of the isolation trenches. The wafer is rapidly spun, which spreads the liquid uniformly over the surface of the wafer after filling the low points on the wafer. An example of a spin-on material is Spinfil™ commercially available from Clariant (Japan) K.K.—Life Science & Electronic Chemicals of Tokyo, Japan. This product is a polysilazane based inorganic spin-on dielectric precursor. Another preferred class of SOD materials are silsesquioxane based materials. Two varieties of these products are available, organic and inorganic. Hydrogen silsesquioxane (HSQ) is a commonly available inorganic SOD material and methyl silsesquioxane (MSQ) is a common inorganic SOD material. However, the skilled practitioner will appreciate that many dielectric precursor materials can be used for these purposes.

Once the insulating precursor 30 has been deposited into the trench, the precursor 30 is converted to an insulator, preferably an oxide. Clariant's Spinfil™ SOD precursor, based upon perhydrosilazane (SiH$_2$NH), has a recommended conversion/densification recipe as follows:

1) 3 min of hot plate baking at 150° C.,
2) 30 min at 700-800° C. in steam ambient
3) Annealing for STI at 800-1000° C. in dry oxygen.

However, this process was found problematic for trenches that are very small, particularly where trenches of a variety of widths across the substrate are to be filled. A more preferred densification process is described in an U.S. patent application by Smythe, et al. (filed Feb. 19, 2004, application Ser. No. 10/782,997), which is hereby incorporated by reference. The densification process of that application uses a ramped temperature process. A prepared wafer is placed in a chamber. The wafer is preferably heated to an initial temperature of between about 200° C. and 600° C., more preferably between 300° C. and 500° C. Preferably, steam is then turned on in the chamber. From the initial temperature, the heat ramps up to a target temperature between approximately 800° C. and 1200° C., more preferably between 900° C. and 1100° C., and most preferably between 950° C. and 1050° C. The increase of the temperature in the chamber is stopped when it gets to this target temperature. The temperature can increase approximately between about 3° C. per minute to 25° C. per minute, more preferably between about 8° C. and 20° C. During the escalation of the temperature, the wafer is in an oxidizing environment, preferably an ambient steam environment. After the temperature is ramped up, the wafer is annealed for approximately 10 to 40 minutes, more preferably between 15 min and 35 min, at the temperature plateau on steady state. In the preferred embodiment, the wafer is annealed in a second oxidizing environment, preferably in a dry oxygen (O$_2$) environment. Finally, after the process is done, the wafer is removed from the chamber.

In this process the steam reacts with the polysilazane on the heated substrate. As the temperature rises, the reaction begins to increase the rate of oxidation. The chemical reaction associated with the densifying process of the preferred spin-on dielectric, polysilazane, is shown below:

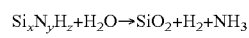

$$Si_xN_yH_z + H_2O \rightarrow SiO_2 + H_2 + NH_3$$

Figure 6:
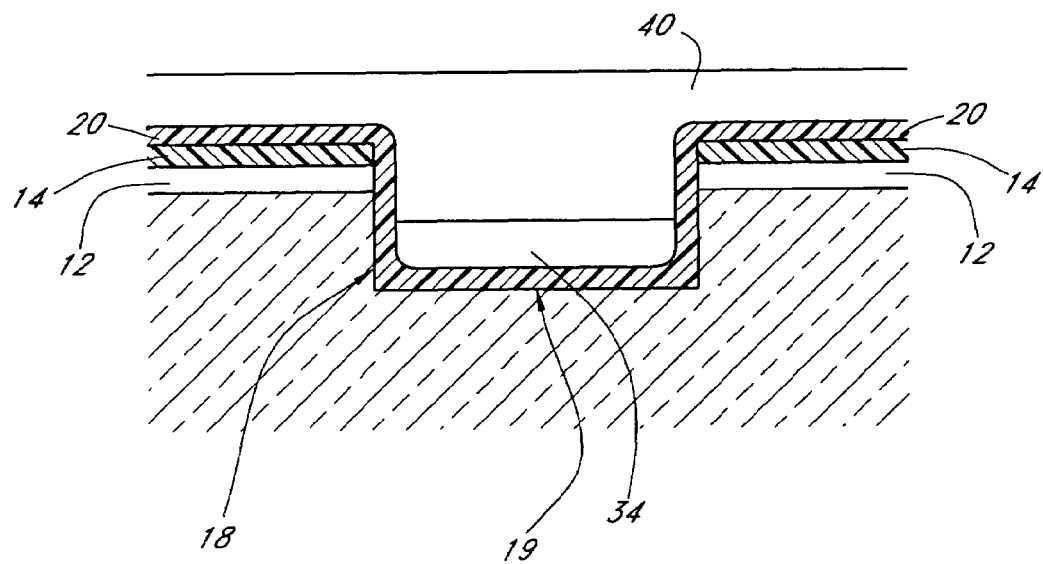
FIG. 6 is a schematic, cross-sectional side view of the substrate of FIG. 4 after a densification and oxidation process.

Additionally, the silicon rich base layer 24 (FIG. 5) is oxidized during the process of converting the precursor 30 into the insulator 40. Particularly for the anisotropically deposited silicon layer of FIG. 4A, the steam environment will encourage the expansion of the base layer. This expansion is seen in FIG. 6, where it can be seen that the oxidized base layer 34 is larger than the prior silicon rich base layer 24 (FIG. 5). This expansion serves to compensate for the volume shrinkage of the SOD material during densification.

Due to the vertical expansion of the oxidation of the silicon rich layer from only one direction, the spin-on oxide 40 is not compressed by the expansion. This leads to consistent etch rates across the densified SOD oxide 40, particularly from wall to wall across the top surface. The thermally oxidized silicon oxide layer 34 has a etch rate that is typical of thermal silicon oxide and thus different from SOD, but because it is buried it is not exposed to wet etches, unlike the sidewall thermal oxide of the '715 application.

When the silicon rich layer 27 (FIG. 4B) is formed by gettering during the plasma process, rather than deposition, the silicon rich layer 27 will oxidize, expand and compensate, to an extent, for the volume shrinkage of the SOD material. This can be seen in FIG. 8. The insulating layer 20 is thinner on the horizontal surfaces, including at the base of the trench, due to the oxidation of the gettered silicon rich layer 27 (FIG. 4B). In a preferred embodiment, the oxidized region 37 of the gettered silicon rich layer 27 (FIG. 4B) is thinner than the oxidized region 34 formed from deposited silicon in FIG. 7. Preferably, the thickness of the thermal oxide 37 formed from the gettered silicon rich layer 27 (FIG. 4B) is between about 6 Å and 25 Å, more preferably between about 10 Å and 20 Å.

Figure 7:
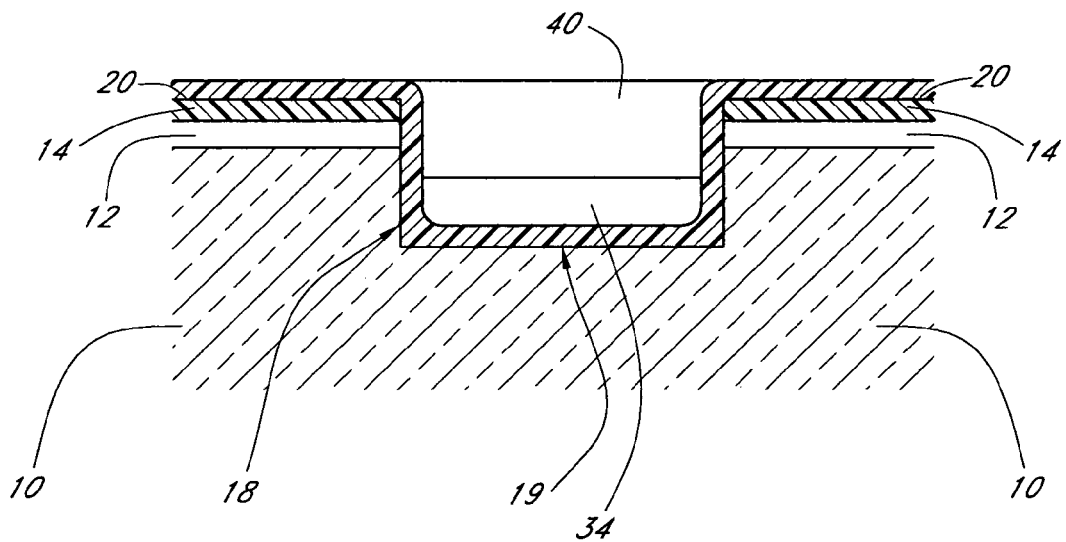
FIG. 7 is a schematic, cross-sectional side view of the substrate of FIG. 6 after an etch back step.

The trench and the surrounding region will typically be subjected to several subsequent etching processes. As seen in FIG. 7, the oxide 40 in the trench is preferably etched back with a chemical mechanical polishing (CMP) or other etch back process, which preferably stops on the liner layer 20 or the underlying nitride layer 14.

The trench will typically face wet cleans and gate cleans during subsequent fabrication steps. Using described embodiments, voids at the sides and top of the trench fill are reduced substantially. For example, during a DRAM fabrication process, a wet clean is performed to remove any oxide from the surface of exposed silicon nitride layers. Typically, a hydrofluoric acid (HF) solution is used to perform the wet clean. The HF solution preferably has a dilution ratio of about 25 parts water to 1 part HF. A gate clean is typically then performed to expose the active areas of the transistors in the DRAM array. The gate clean may be performed with a wet etch process or a dry etch process. In either case, the insulator in the trench preferably has consistent etch rates laterally across the SOD material. This leads to a elimination or substantial reduction in pitting, or "dishing", that leads to non-planarity issues for subsequent processing.

Structure

An embodiment is seen in FIG. 7 after an etch back of the trench fill material 40. Through the use of the spin-on deposition process, the trench is preferably filled without voids, which can negatively affect the isolation effects of the trench. The spin-on precursor has been oxidized to form a SOD oxide 40, which provides excellent insulation. The silicon oxide adheres well to the surface of the trench walls due to the compression from the expansion of the silicon rich base layer, which has been oxidized to form a relatively nitrogen-free oxide layer 34.

Depending on the densification process, the nitrogen content of the trench fill materials can vary. However, in one embodiment, there is a first layer of silicon oxide 34, which has essentially no nitrogen. This oxide layer 34, preferably thermal oxide, is substantially thinner along the vertical walls 18 of the trench than along the base of the trench. Preferably, the oxide 34 along the walls 18 has a thickness of less than 33% of the thickness of the oxide along the base 19 of the trench, more preferably less than 20%. This oxide 34 was preferably formed by oxidation of the silicon rich base layer 24 (FIG. 5). Preferably, the first silicon oxide layer 34 has a thickness of between about 50 Å and 250 Å, more preferably between about 100 Å and 200 Å. A second layer of silicon oxide 40 is over the first layer 24. The second layer contains nitrogen and other contaminants, which are remnants of the SOD precursor material. Preferably, the second silicon oxide layer has a thickness of between about 2000 Å and 4000 Å, more preferably between about 3000 Å and 3500 Å

Figure 8:
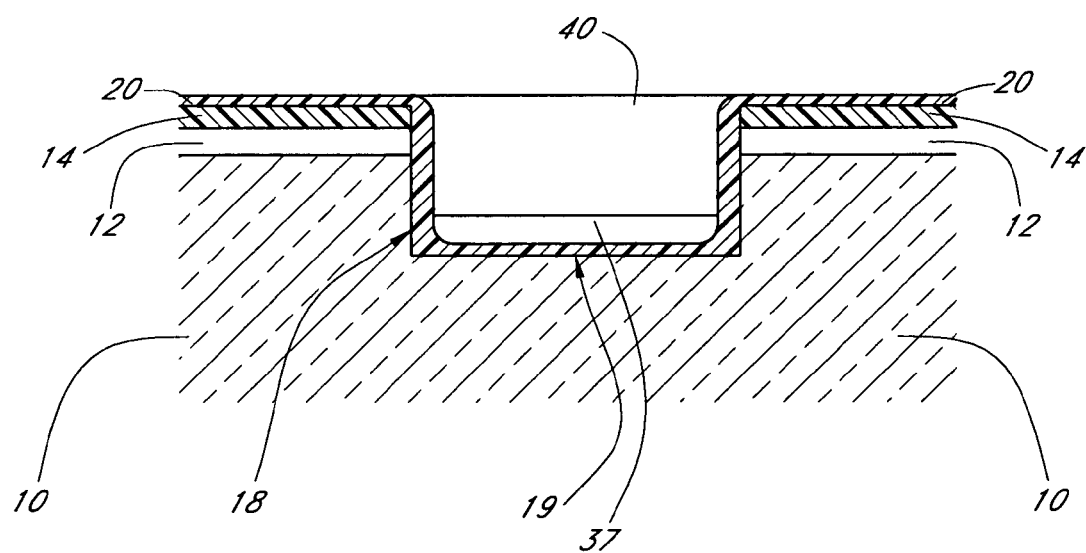
FIG. 8 is a schematic cross-sectional side view of the substrate of FIG. 4B after filling, densification/oxidation, and etch back.

In another embodiment illustrated in FIG. 8, the lower silicon layer is a very thin oxide layer 37. This is formed by oxidizing a silicon rich region of the liner layer 20 created by gettering nitrogen in a top portion of the base region of a silicon nitride liner layer by an anisotropic plasma process (FIG. 4B). In a preferred embodiment, this thermally oxidized layer 37 is between about 6 Å and 25 Å, more preferably between about 10 Å and 20 Å.

The oxide layers are preferably separated from the substrate by the liner layer 20. Preferably the liner layer is silicon nitride, but other materials may also be used as the liner layer 20. The liner layer 20 may be partially oxidized near the base of the trench.

In an unpictured embodiment, a smoothing oxide layer is positioned between the liner layer 20 and the substrate 10 along the sidewalls 18 and base 19 of the trench resulting from oxidizing the surfaces of the trench before depositing a liner layer 20. The smoothing oxide layer preferably has a thickness of between about 30 Å and 100 Å. The oxidation of the trench walls 18 and base 19 serves to repair damage from the trench formation. The smoothing oxide layer also protects the active areas in the substrate 10 from damage that might be caused during processing. A similar oxide layer can be formed in other embodiments described herein.

The isolation structures of the described embodiments preferably have a consistent etch rate laterally across the trench. Thus, the trenches have reduced dishing and pitting across the surface of the insulation material.

It will be appreciated by those skilled in the art that various omissions, additions and modifications may be made to the methods and structures described above without departing from the scope of the invention. All such modifications and changes are intended to fall within the scope of the invention, as defined by the appended claims.

We claim:

1. An electrical isolation structure comprising:
   a trench formed in a substrate, wherein the trench has walls and a base;
   an oxidation barrier lining the trench;
   a thermal oxide lining the trench, wherein the thermal oxide is substantially thinner along the walls than along the base; and
   a spin-on dielectric over the thermal oxide.

2. The structure of claim 1, wherein the thermal oxide has a thickness along the walls of less than 33% of a thickness of the thermal oxide along the base.

3. The structure of claim 1, wherein the thermal oxide is substantially free of nitrogen.

4. The structure of claim 1, wherein the spin-on dielectric comprises silicon oxide.

5. The structure of claim 4, wherein the spin-on dielectric further comprises nitrogen.

6. The structure of claim 1, wherein the oxidation barrier comprises a silicon nitride layer lining the trench.

7. The structure of claim 6, wherein the silicon nitride layer has a thickness of between about 50 Å and 100 Å.

8. The structure of claim 7, wherein the silicon nitride layer has a thickness of between about 65 Å and 75 Å.

9. The structure of claim 6, further comprising a uniformly thick thermal oxide layer between the substrate and the silicon nitride layer.

10. The structure of claim 9, wherein the thickness of the uniformly thick thermal oxide layer is between about 30 Å and 100 Å.

11. The structure of claim 6, wherein the silicon nitride layer lies over the substrate and under the thermal oxide.

12. The structure of claim 11, wherein the silicon nitride layer is thinner along the base than along the walls.

13. The structure of claim 1, wherein the trench has a depth of between about 1,000 Å and 10,000 Å.

14. The structure of claim 13, wherein the trench has a depth of between about 2,500 Å and 6,000 Å.

15. The structure of claim 1, wherein the spin-on oxide has a thickness of between about 2000 Å and 4000 Å.

16. The structure of claim 15, wherein the spin-on oxide has a thickness of between about 3000 Å and 3500 Å.

17. An electrical isolation structure comprising:
   a trench formed in a substrate, wherein the trench has walls and a base;
   a thermal oxide lining the trench, wherein the thermal oxide has a thickness at the base of the trench of between about 50 Å and 250 Å and the thermal oxide is substantially thinner along the walls than along the base; and
   a spin-on dielectric over the thermal oxide.

18. The structure of claim 17, wherein the thermal oxide has a thickness at the base of the trench of between about 100 Å and 150 Å.

19. An electrical isolation structure comprising:
   a trench formed in a substrate, wherein the trench has walls and a base;
   a thermal oxide lining the trench, wherein the thermal oxide has a thickness at the base of the trench of between about 6 Å and 25 Å and the thermal oxide is substantially thinner along the walls than along the base; and
   a spin-on dielectric over the thermal oxide.

20. The structure of claim 19, wherein the thermal oxide has a thickness at the base of the trench of between about 10 Å and 20 Å.

21. An integrated circuit having an electrical isolation structure comprising:
a trench formed in a recess;
an oxidation barrier over a floor and sidewalls of the trench;
a thermal oxide layer preferentially formed on the floor of the trench; and
a spin-on deposition dielectric over the thermal oxide layer within the trench.

22. The integrated circuit of claim 21, wherein the thermal oxide is substantially free of nitrogen.

23. The integrated circuit of claim 21, wherein the thermal oxide extends over the floor and sidewalls of the trench, the thermal oxide being thinner over the sidewalls than over the floor.

24. The integrated circuit of claim 23, wherein the thermal oxide over the sidewalls is less than one third as thick as the thermal oxide over the floor.

25. The integrated circuit of claim 24, wherein the thermal oxide over the sidewalls is less than one fifth as thick as the thermal oxide over the floor.

26. The integrated circuit of claim 21, wherein the spin-on deposition dielectric comprises silicon oxide.

27. The integrated circuit of claim 21, wherein the thermal oxide layer lies over the oxidation barrier.

28. The integrated circuit of claim 21, wherein the oxidation barrier comprises silicon nitride.

29. The integrated circuit of claim 21, wherein the oxidation barrier has a thickness of between about 50 Å and 100 Å.

30. The integrated circuit of claim 29, wherein the oxidation barrier has a thickness of between about 65 Å and 75 Å.

31. The integrated circuit of claim 21, wherein the thermal oxide layer has a thickness at the floor of the trench of between about 6 Å and 25 Å.

32. The integrated circuit of claim 31, wherein the thermal oxide layer has a thickness at the floor of the trench of between about 10 Å and 20 Å.

33. The integrated circuit of claim 32, wherein the oxidation barrier is thinner along the floor of the trench than along the sidewalls.

34. The integrated circuit of claim 21, wherein the thermal oxide layer has a thickness at the floor of the trench of between about 50 Å and 250 Å.

35. The integrated circuit of claim 34, wherein the thermal oxide layer has a thickness at the floor of the trench of between about 100 Å and 200 Å.

36. The integrated circuit of claim 21, further comprising a smoothing oxide layer between the oxidation barrier and the floor and sidewalls of the trench.

37. The integrated circuit of claim 36, wherein the smoothing oxide layer has a thickness between about 30 Å and 100 Å.

* * * * *